(12) United States Patent
Miao et al.

(10) Patent No.: US 8,189,645 B2
(45) Date of Patent: May 29, 2012

(54) ADAPTED SEMICONDUCTOR LASER PACKAGE

(75) Inventors: Rongsheng Miao, El Monte, CA (US); Nghia Kha, Diamond Bar, CA (US); Todd Edward Olson, San Marino, CA (US); Genzao Zhang, Ottawa (CA); Bryon L. Kasper, Sierra Madre, CA (US)

(73) Assignee: Emcore Corporation, Albuquerque, NM (US)

( * ) Notice: Subject to any disclaimer, the term of this patent is extended or adjusted under 35 U.S.C. 154(b) by 311 days.

(21) Appl. No.: 12/637,665

(22) Filed: Dec. 14, 2009

(65) Prior Publication Data

US 2010/0158062 A1 Jun. 24, 2010

Related U.S. Application Data

(63) Continuation-in-part of application No. 12/250,284, filed on Oct. 13, 2008, now Pat. No. 7,633,992.

(51) Int. Cl.
 *H01S 3/08* (2006.01)
(52) U.S. Cl. ........................................ 372/108; 372/101
(58) Field of Classification Search .................. 372/101, 372/108, 703
 See application file for complete search history.

(56) References Cited

U.S. PATENT DOCUMENTS

| | | | |
|---|---|---|---|
| 5,852,257 A | 12/1998 | Dittman et al. | |
| 6,404,042 B1 | 6/2002 | Sone et al. | |
| 6,614,659 B2 | 9/2003 | Feigenbaum et al. | |
| 6,697,414 B1 | 2/2004 | Kato et al. | |
| 6,991,498 B2 | 1/2006 | Wertz et al. | |
| 2003/0107874 A1 | 6/2003 | Feigenbaum et al. | |
| 2005/0085104 A1 | 4/2005 | Stockhaus et al. | |
| 2005/0123249 A1 | 6/2005 | Yun et al. | |
| 2006/0165353 A1* | 7/2006 | Miao et al. | 385/88 |
| 2007/0155197 A1* | 7/2007 | Miao et al. | 439/67 |
| 2009/0116838 A1 | 5/2009 | Kihara | |

* cited by examiner

*Primary Examiner* — Armando Rodriguez

(57) ABSTRACT

An adapted semiconductor laser package that may convert a first type of package pin-out arrangement to a desired pin-out arrangement. The laser package may include a laser package including a laser, an isolator, a lens, a fiber sleeve, and a pin-out arrangement. The isolator and the fiber sleeve may be jointly arranged away from the laser. The laser package may also include an adapter with a first section with a plurality of holes geometrically arranged and mated with the package pin-out arrangement, a second section with an adapter pin-out arrangement with two rows of pins extending along opposite sides of the package, and electrical connections between the plurality of holes and the pins.

19 Claims, 9 Drawing Sheets

ADAPTED SEMICONDUCTOR LASER PACKAGE

RELATED APPLICATIONS

The present application is a continuation-in-part of U.S. application Ser. No. 12/250,284, filed on Oct. 13, 2008, now U.S. Pat. No. 7,633,992 which is herein incorporated by reference in its entirety.

The present application is related to U.S. application Ser. No. 11/325,396, which is herein incorporated by reference in its entirety.

FIELD OF THE INVENTION

The invention relates to electro-optical converters and more particularly to semiconductor laser packages or modules including an optical fiber and a semiconductor laser device, such as a semiconductor diode, optically coupled to the optical fiber.

BACKGROUND INFORMATION

Semiconductor lasers are used many different applications, such as in optical fiber communications, where they can be used at the interface between the electronic signal processing circuitry and the optical transmission lines. The semiconductor laser device generates light that is transmitted through the optical fiber. For this purpose, a semiconductor laser package or module includes the semiconductor laser device and portion of the optical fiber, as well as other optical components, including at least one lens and at least one isolator. These components are held at fixed positions within the module so as to assure that the light generated by the laser device is effectively coupled into the optical fiber at an end of the optical fiber. The process of aligning an optical fiber to a laser device and fixing it in place is sometimes referred to as fiber pigtailing. Currently in the industry, there are two types of form factors for laser packages or modules. One is the flat pack, and the other is the coaxial or TO (transistor outline) package.

The flat pack form factor package includes arrangements such as butterfly packages, mini-tail packages, mini dil packages, etc. Flat form factor laser modules basically comprise a set of components, including a semiconductor laser device, lens, an isolator, and a fiber sleeve holding an optical fiber. These components can be mounted on some kind of support or optical bench which is housed inside a box-like hermetically sealed housing, and the laser device (such as the laser diode) and its related circuitry, sometimes referred to as a laser block, are electrically connected to one or more pins, which can extend laterally from the housing (such as in the so-called butterfly laser modules).

FIG. 1 shows one possible configuration of some of the above-mentioned elements: a laser block 11 (including a semiconductor laser device 1 such as a laser diode, having light-emitting surface or end), an optical lens 2 arranged in a lens holder 21, an isolator 3A arranged in an isolator holder 3B, and an optical fiber sleeve 4 (also known in the art as a ferrule, basically made up of a rigid tube) arranged in a sleeve holder 4A, are all arranged on an L-shaped support 5A. The lens 2 is arranged for focusing the light emitted by the laser device onto an end of an optical fiber (not shown in FIG. 1) and the isolator is arranged to prevent light from being reflected back towards the laser device from the optical fiber end and the surrounding parts of the assembly. Suitable lenses, isolators and fiber sleeves (or ferrules) are well known in the art and there is no need to further describe these elements here.

The coaxial or TO laser package design has shown great adoption potential due to its ease of manufacturing and low cost. FIGS. 2A, 2B, and 2C illustrate various aspects of coaxial laser packages. The coaxial laser package 200 includes a header subassembly 202 and a fiber module 204. The coaxial laser package 200 further includes a coaxial pin-out 206, with pins extending perpendicularly from the header surface of the header subassembly 202. Various forms of pin orientations may be utilized, including a circular orientation as illustrated in FIG. 2B, and an in-line orientation as illustrated in FIG. 2C. The fiber module 204 couples the laser lights coming out of the header subassembly 202 for its subsequent usage in an optoelectronic device. A laser diode, an optical lens arranged in a lens holder, other optical devices (i.e. an isolator) and IC components (not shown) are mounted inside the header subassembly 202 and hermetically sealed with a can 208. FIG. 3 illustrates of a coaxial laser package 200 with a housing 302 for mounting the can 208 to a heat sink (not shown in FIG. 3) for cooling purposes.

It may be desirable to use a coaxial laser package in optoelectronic circuit boards due to their ease of manufacturing and low cost. However, existing optoelectronic circuit board designs are adapted to use a butterfly laser package. Therefore, there is a need to configure a coaxial laser package for use with optoelectronic circuit board designs.

SUMMARY OF THE INVENTION

The present application is directed to an adapted semiconductor laser package. The adapted semiconductor laser package may include a coaxial laser package including a laser, an isolator, a lens, a fiber sleeve, and a pin-out arrangement. The isolator and the fiber sleeve may be jointly arranged away from the laser. The laser package may also include an adapter that converts the package pin-out arrangement to a desired pin-out arrangement for a printed circuit board. The adapter may include a first section with a plurality of holes geometrically arranged and mated with the package pin-out arrangement, a second section with an adapter pin-out arrangement with two rows of pins extending along opposite sides of the package, and electrical connections between the plurality of holes and the pins. The laser package may include a housing that extends around at least a portion of an exterior of the coaxial laser package and the adapter. The coaxial laser package and the adapter may be sealed in an interior of the housing. The housing may extend over a limited portion of the adapter and may be positioned between the two rows of pins of the second section of the adapter. The first section of the adapter may include a substantially circular shape. The plurality of holes may be arranged in one of a circular arrangement and an in-line arrangement. The adapter may include a unitary construction and the first section may be substantially perpendicular to the two rows of pins.

One embodiment of the an adapted semiconductor laser package may include a coaxial laser package with a semiconductor laser device, a fiber sleeve that holds an optical fiber, a lens that focuses light from the laser device onto an end of the optical fiber, an isolator that prevents the light from being reflected back towards the laser device, a housing that jointly positions the isolator and the fiber sleeve away from the laser device, and a plurality of outwardly-extending pins in a pin-out arrangement. The laser package may also include an adapter with a pin-in arrangement designed to electrically couple with the package pin-out arrangement, an adapter pin-out arrangement geometrically identical to the desired pin-out arrangement, and one-to-one electrical connections between the pin-in arrangement and the adapter pin-out arrangement. The pin-out arrangement may include two rows of pins arranged on opposite sides of the adapter. The two rows of pins may include seven butterfly pins. The laser package may include a housing that extends around an exterior of the package and the adapter and holds the package and the adapter together and holds the adapter pin-out arrangement in a single flat format. The housing may be fabricated, at least in part, from a thermal conductor. The housing may have a cylindrical bore that accommodates at least the plurality of outwardly-extending pins in the pin-out arrangement and the adapter pin-in arrangement. The housing may include a two-piece construction. The pin-in arrangement may include a plurality of holes that are geometrically arranged to mate with the pin-out arrangement of the package. There may be a one-to-one electronic coupling between the annular holes of the pin-in arrangement and the pin-out of the adapter pin-out arrangement.

Another embodiment of the adapted semiconductor laser package may include a coaxial laser package including a laser, an isolator, a lens, a fiber sleeve, a hermetically sealed can, and a package pin-out arrangement comprising a plurality of outwardly-extending package pins. The laser package may also include an adapter that converts the package pin-out arrangement to a desired pin-out arrangement, the adapter including a receiving section with a plurality of holes that receive the package pins, a first row of pins that extend on a first side of the receiving section and a second row of that extend on a second side of the receiving section, the first and second rows being aligned in a common plane and each include a plurality of spaced-apart pins that are perpendicular to the package pins, the adapter also including electrical connections that extends between the plurality of holes and the pins. The laser package may also include a housing that extends around an exterior of at least a portion of the coaxial laser package and the adapter.

BRIEF DESCRIPTION OF THE DRAWINGS

The fact that two items are referred to by the same reference numeral does not imply that they are necessarily identical. Identical reference numbers can also be used for similar or corresponding elements, in order to facilitate comprehension of the drawings.

DESCRIPTION OF AN EMBODIMENT OF THE INVENTION

Figure 1:
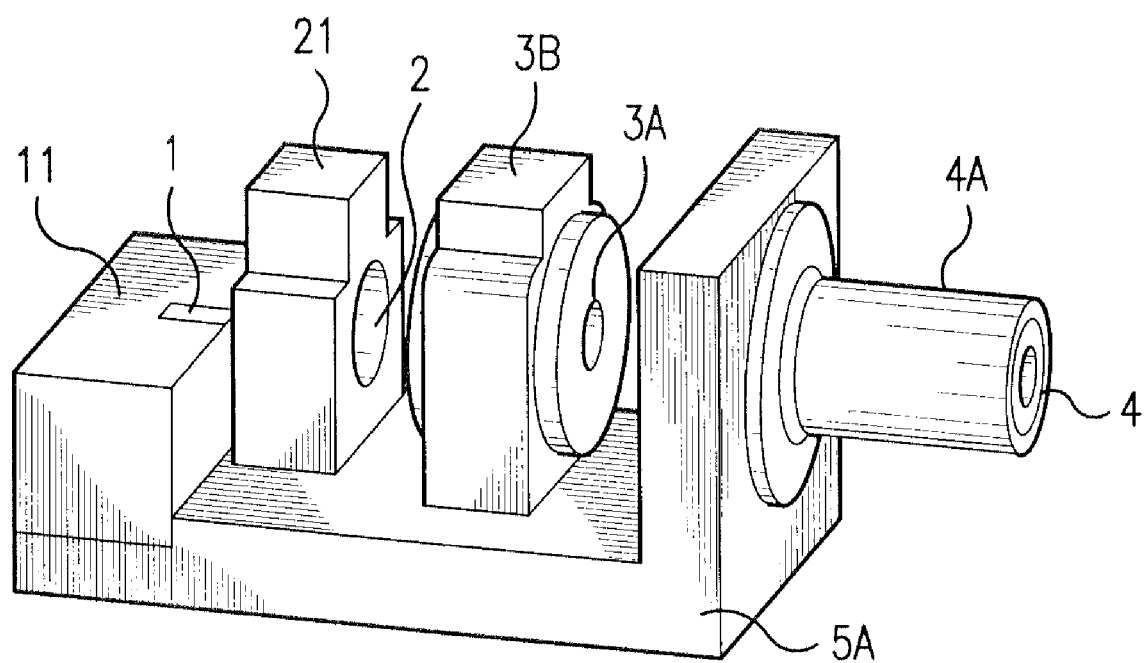
FIG. 1 illustrates an arrangement in which the isolator and the fiber sleeve are not jointly arranged within a second housing.
Figure 4:
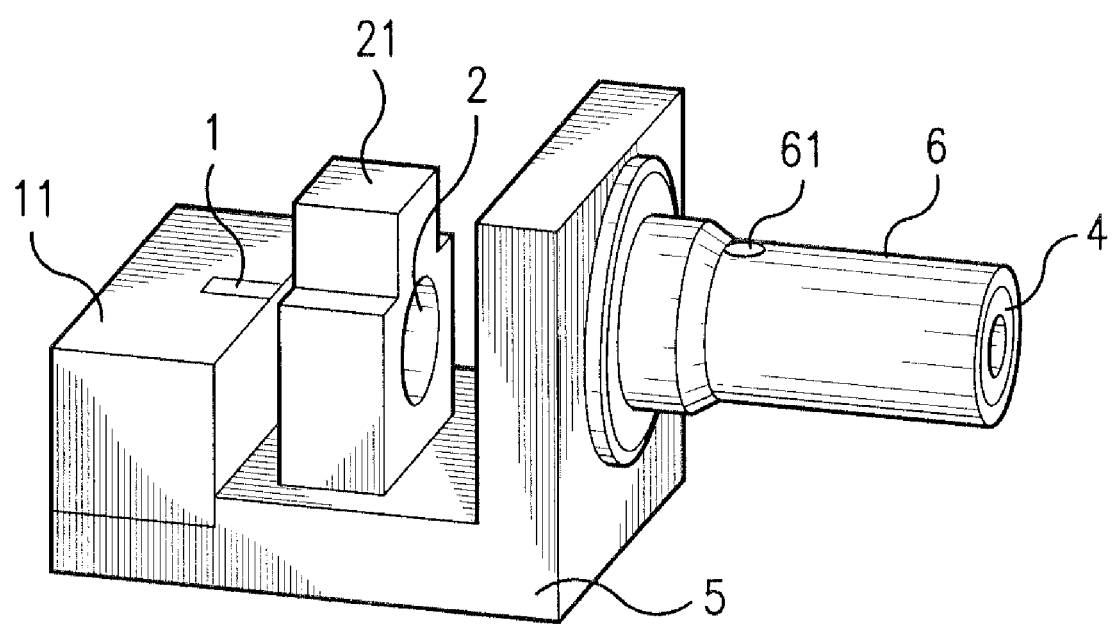
FIGS. 4 and 5 illustrate some of the elements of a laser module in accordance with one possible embodiment of the invention.

FIG. 4 illustrates one embodiment of the invention, including a laser block 11 including a semiconductor laser device 1—such as a laser diode—having a light-emitting surface or end, and an optical lens 2 arranged in a lens holder 21. The laser block 11 and the lens 2 are both arranged on a first portion of an L-shaped support 5. However, contrary to what is illustrated in FIG. 1, in the embodiment of FIG. 4 there is no separate isolator holder arranged on the support. Instead, a second housing 6 is provided, in which both the isolator (not shown in FIG. 4) and the fiber sleeve 4 are arranged.

Figure 5:
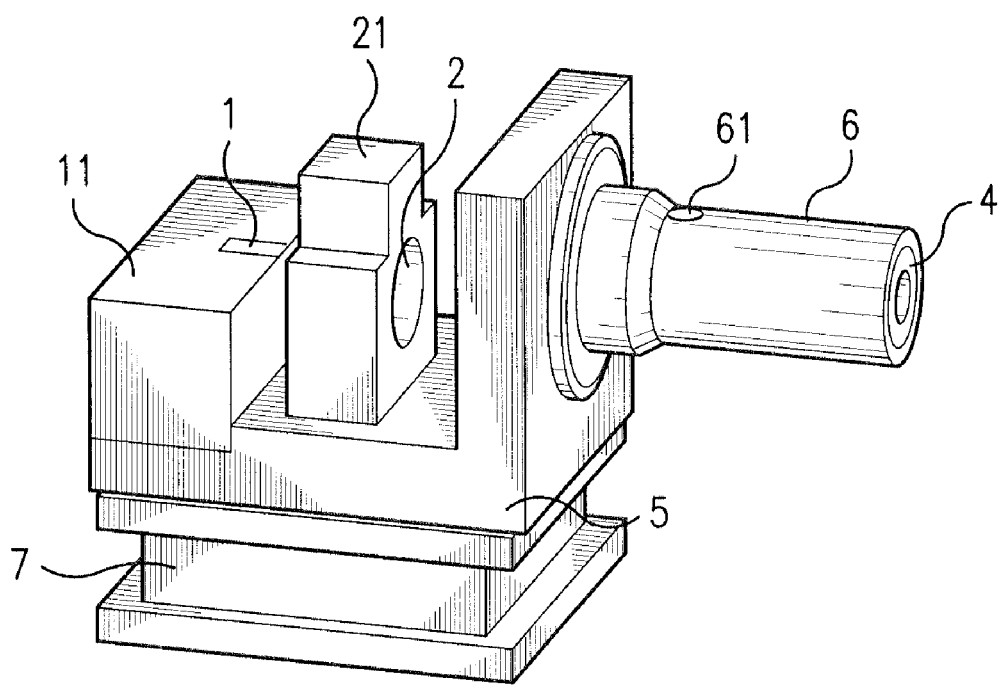

The laser block 11 and the lens 2 are both placed on a first arm of the L-shaped support 5. The second arm, which extends perpendicularly to the first arm, includes a through hole, and the second housing 6 is placed in correspondence with the through hole. FIG. 5 illustrates the assembly of FIG. 4 placed on a cooling element 7, such as a thermo-electric cooler. If compared to FIG. 1, it is clear from FIGS. 4 and 5 that the support 5 can be made shorter. The shorter support 5 makes it possible to use a shorter cooling element 7.

Figure 6:
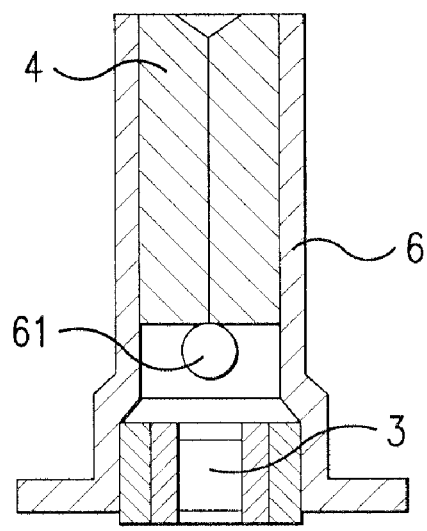
FIG. 6 schematically illustrates a longitudinal cross section of the second housing.

FIG. 6 illustrates how the isolator 3 and the fiber sleeve 4 are housed in the common housing 6. The housing 6 has a first portion with a first inner diameter arranged to house the isolator 3, and a second portion with a second inner diameter, smaller than the first inner diameter, arranged to house the fiber sleeve 4. The isolator 3 is abutting against a seat formed at the transition between the first inner diameter and the second inner diameter and is epoxy bonded to the housing 6. A through hole 61 is provided which makes it possible to inspect, from the outside, the end of the fiber sleeve and the space between fiber sleeve 4 and the isolator 3. This makes it possible to observe, from the outside, the exact position of the end of the optical fiber (not shown in FIG. 6), and thus to control the correct position and alignment thereof.

Figure 7:
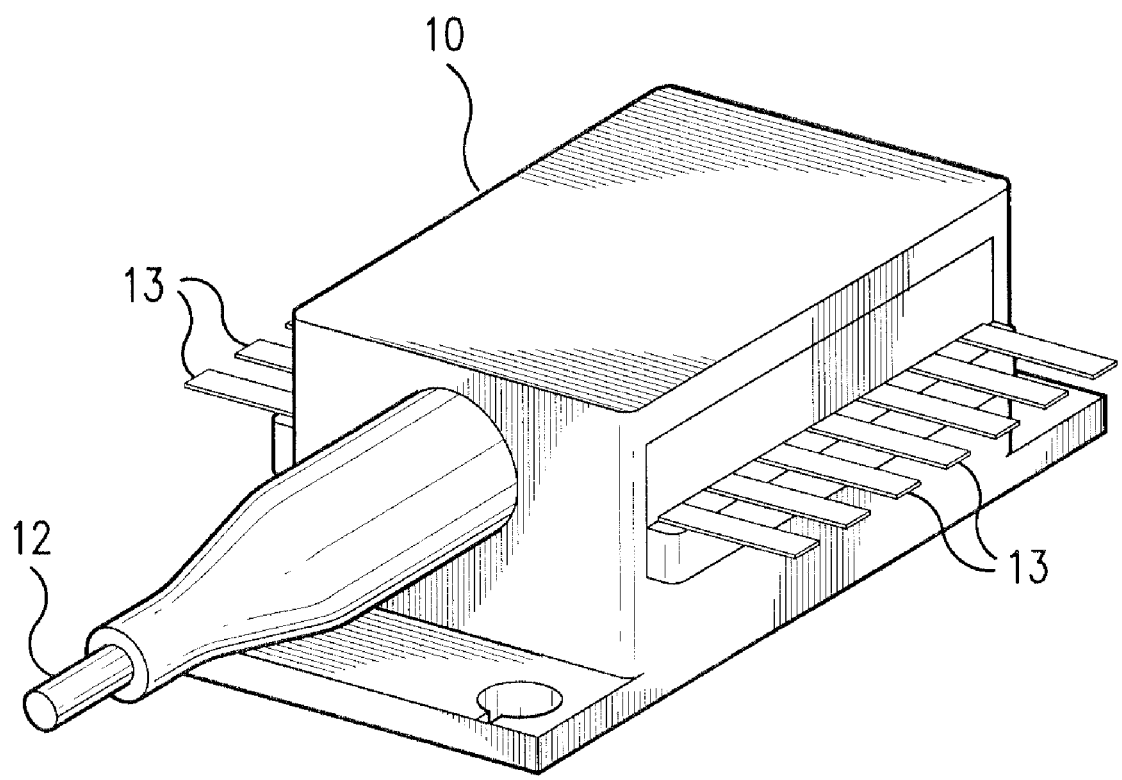
FIG. 7 is a general view of a laser module.

FIG. 7 schematically illustrates a butterfly laser package, with a first housing 10 which houses an arrangement as illustrated in FIG. 5, and from which a plurality of electrodes 13 extend laterally. An optical fiber 12 extends into the laser module, where it is held in position by the fiber sleeve.

Figure 2A:
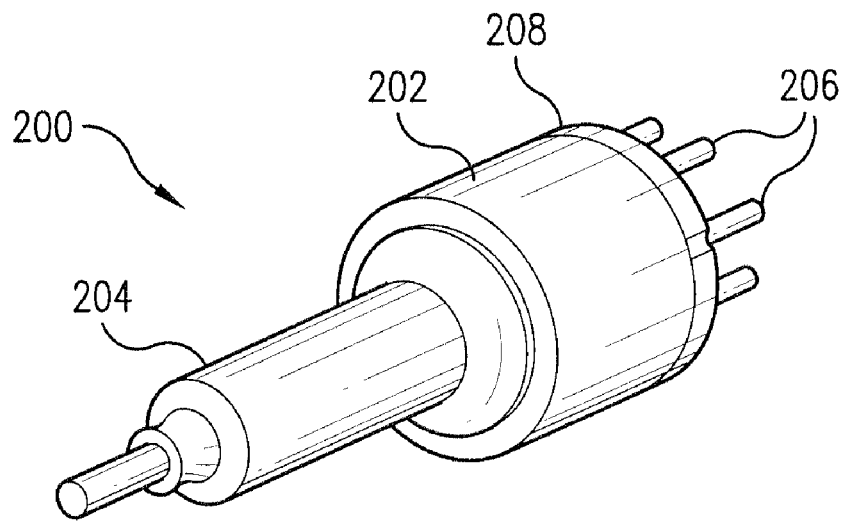
FIG. 2A illustrates an isometric view of the coaxial laser package as known in the art.
Figure 8:
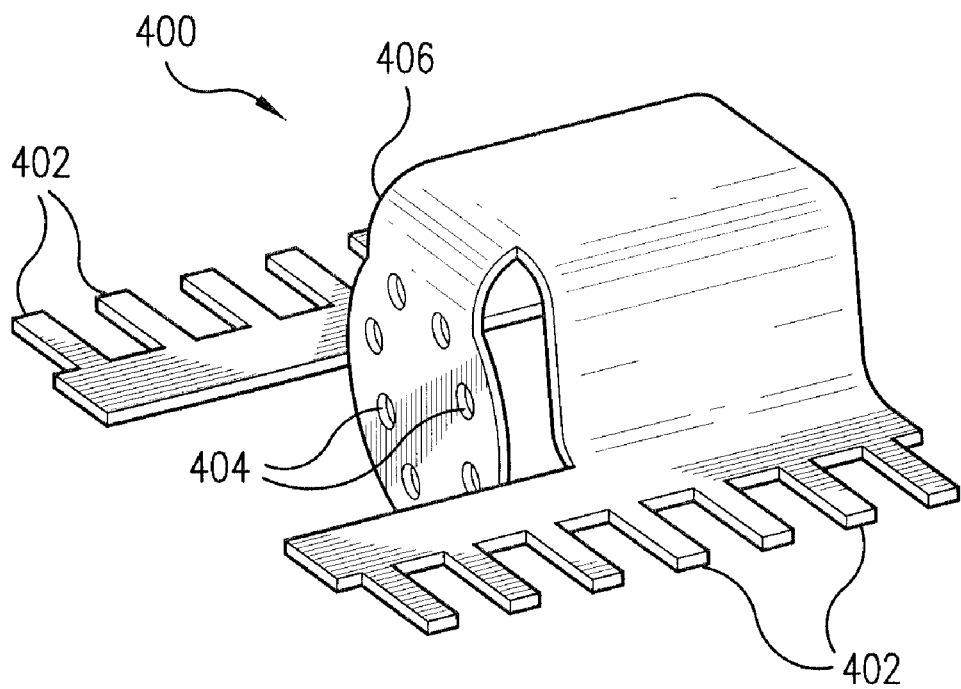
FIG. 8 illustrates an isometric view of an adapter used in accordance with an embodiment of the invention.

An adapter 400 may be used to convert a coaxial laser package to a butterfly laser package. In other words, the adapter 400 adapts the co-axial pin-out 206 of FIG. 2A to the butterfly pinout 13 of FIG. 7. FIG. 8 illustrates an adapter 400 with two rows of pins 402 arranged in a design geometrically identical to a desired butterfly pin-out. The two parallel rows of pins 402 in the desired pin-out are on the same plane, which makes it convenient to integrate the package with an opto-electronic circuit board. An exemplary pitch of the pins 402 is 2.54 mm, but other pitches are possible depending on the desired form factor. FIG. 8 includes seven pins on each side of the adapter 400. Other embodiments may include different numbers of pins.

Figure 2B:
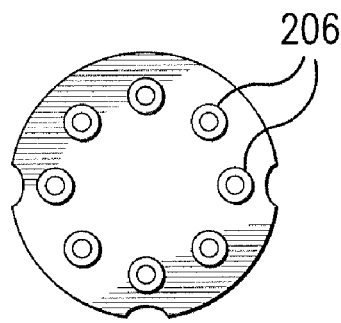
FIG. 2B illustrates a view of one known orientation of pins in a coaxial pin-out.
Figure 2C:
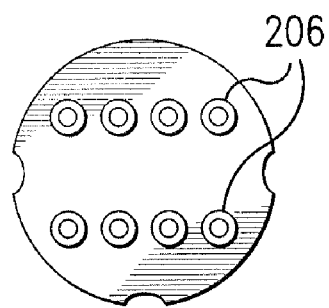
FIG. 2C illustrates a view of another known orientation of pins in a coaxial pin-out.
Figure 3:
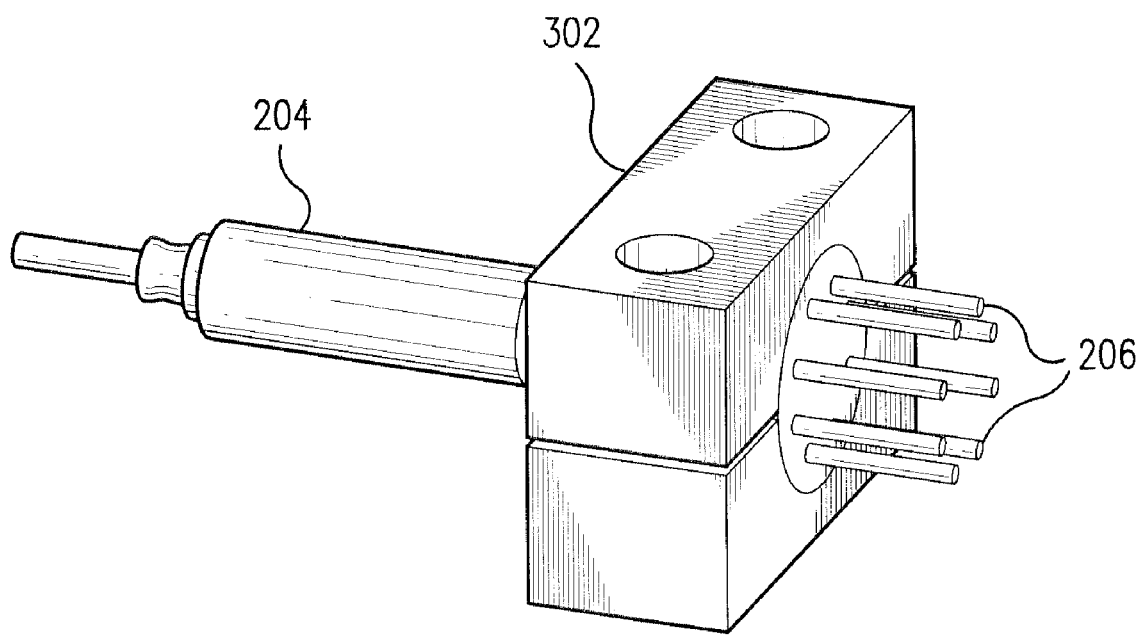
FIG. 3 illustrates a metal housing used on coaxial laser package to connect the package to a heat sink.

The adapter 400 also includes a circular face 406 with holes 404 configured to receive and electrically couple with the coaxial laser package pin-out 206. FIG. 8 includes the holes 404 arranged in a circular configuration that corresponds to a circular pin-out 206 such as that illustrated in FIG. 2B. The holes 404 may also be arranged in an in-line configuration that corresponds to the pin-out 206 of FIG. 2C. The face 406 may be positioned perpendicular to the pins 402.

The adapter 400 may be formed as a flat piece and subsequently shaped into the desired configuration. In one embodiment, the adapter 400 is made of a series of copper layers separated by one or more layers of polyimide and/or adhesives. In one specific embodiment, the flex-circuit includes three copper layers.

The adapter 400 may further include electronic traces (not shown in Figure) that between the holes 404 and the pins 402. The traces may provide one-to-one electrical connections between the package pin-out 206 and the pins 402. The traces may extend within an interior of the adapter 400. These features eliminate the need to bend the coaxial pin-out 206 formed on the coaxial laser package 200 to make it adaptable for the butterfly application. In one embodiment, the electrical traces of the adapter 400 may provide one-to-one connections between the pins 206 of the coaxial pin-out and the desired pins 402 of the pin-out. In another embodiment, certain pins 206 of the coaxial pin-out may be connected to more than one pin 402 of the desired pin-out. Alternatively, certain pins 206 in the coaxial pin-out may be not connected to pins 402 of the desired pin-out. It would be apparent to one skilled in the art that various connections between the pins 206 of the coaxial pin-out and the pins 402 of desired pin-out may be used based on the application of the flex-circuit 400.

Figure 9:
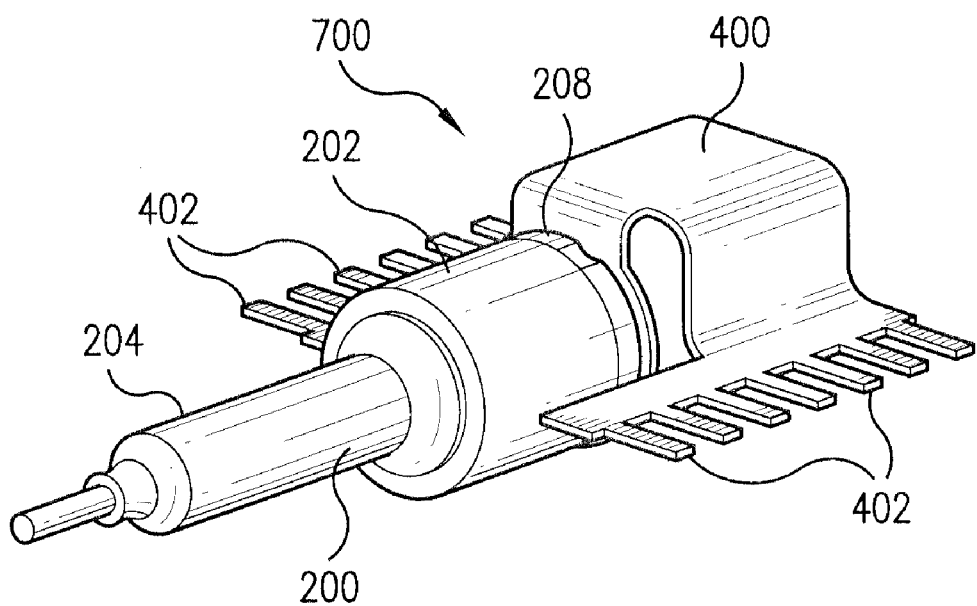
FIG. 9 illustrates an isometric view of an adapted semiconductor laser package in accordance with an embodiment of the invention.

FIG. 9 illustrates an isometric view of an adapted semiconductor laser package 700. The coaxial pin-out 206 of the coaxial laser package 200 is mated with the holes 404 formed on the circular surface 406 of the adapter 400. This configuration enables the formation of continuous electrical connections between the pins of coaxial pin-out 206 and desired pin-out 402.

Figure 10:
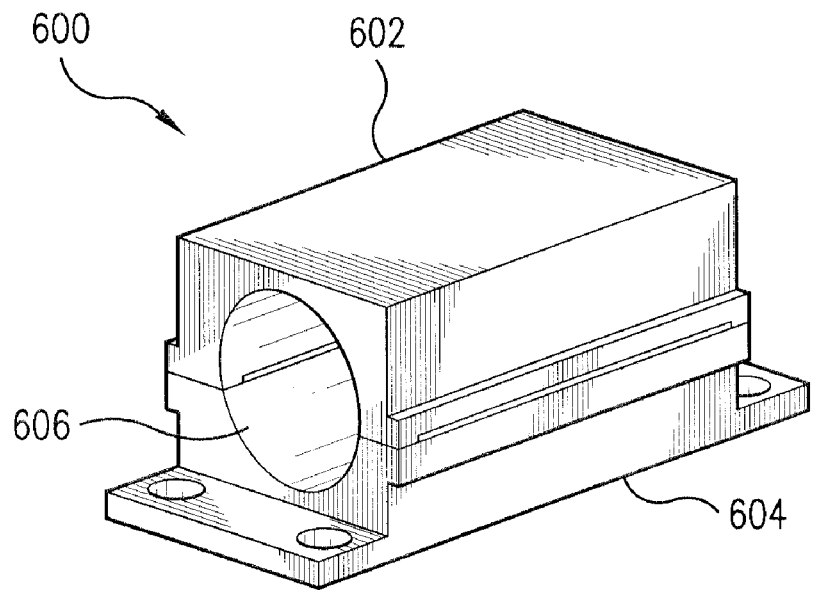
FIG. 10 illustrates an isometric view of a housing for use in conjunction with the adapter, in accordance with an embodiment of the invention.

FIG. 10 illustrates an isometric view of a housing 600 that may be used in conjunction with the adapted semiconductor laser package 700. The housing 600 is a two-piece arrangement with a top portion 602 and a bottom portion 604. The top and bottom portions 602, 604 may be fastened together in various manners, including screws and adhesives. The housing 600 has a cylindrical bore 606 that is formed by a semi-circular half formed within the top portion 602 and a corresponding semi-circular half formed within the bottom portion 604. In various embodiments, there may be other internal cavities (not shown in the Figure) formed within housing 600 to suitably accommodate the coaxial laser package 200 and/or the adapter 400. The housing 600 holds the adapter 400 and coaxial laser package 200 together in a single flat format. Further, it serves as a heat sink to dissipate heat generated from the laser diode and other internal heat sources. For example, the housing 600 is thermally conductive to the hot side of Thermal Electronic Cooler (TEC) in a cooled first laser package, and serves to dissipate the heat produced by the laser diodes and the TEC in the first laser package. The housing 600 may be made with materials having high thermal conductivity, such as aluminum, copper or other metals. In yet another embodiment, an interface material can be interposed between the can 208 of the coaxial laser package 200 and cylindrical bore 606 of the housing 600 for thermal contact purposes.

Figure 11:
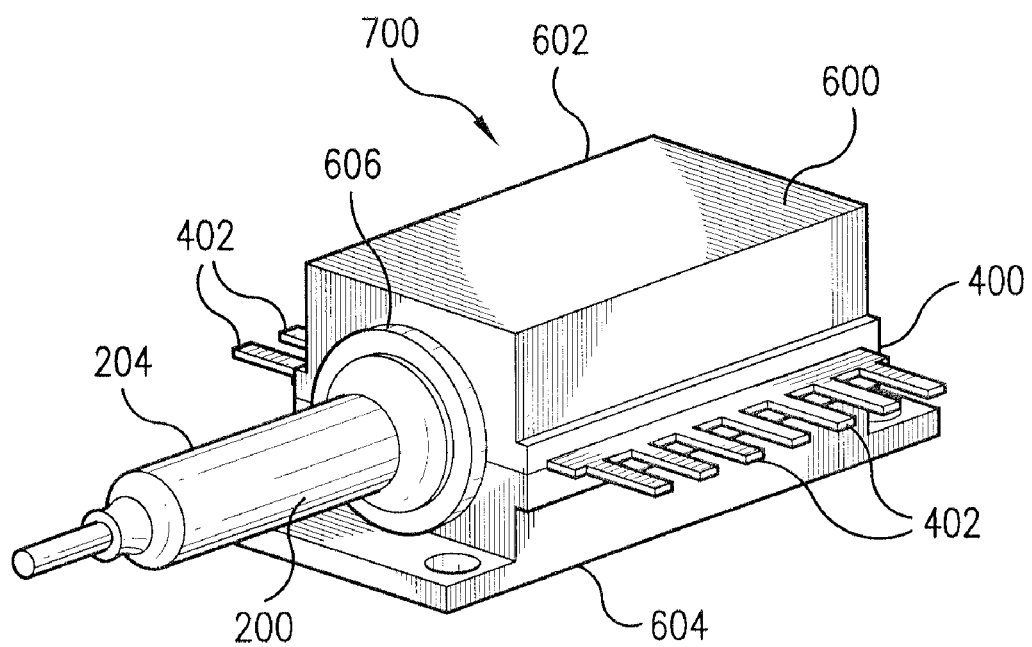
FIG. 11 illustrates an isometric view of an adapted semiconductor laser package in accordance with an embodiment of the invention.

FIG. 11 illustrates an embodiment of an adapted semiconductor laser package 700 that comprises a coaxial laser package 200 with an adapter 400 and a housing 600. The coaxial laser package 200, adapter 400, and housing 600 are assembled together and sealed. The adapted laser package 700 is ready to be used in butterfly laser package applications without any modifications.

Figure 12:
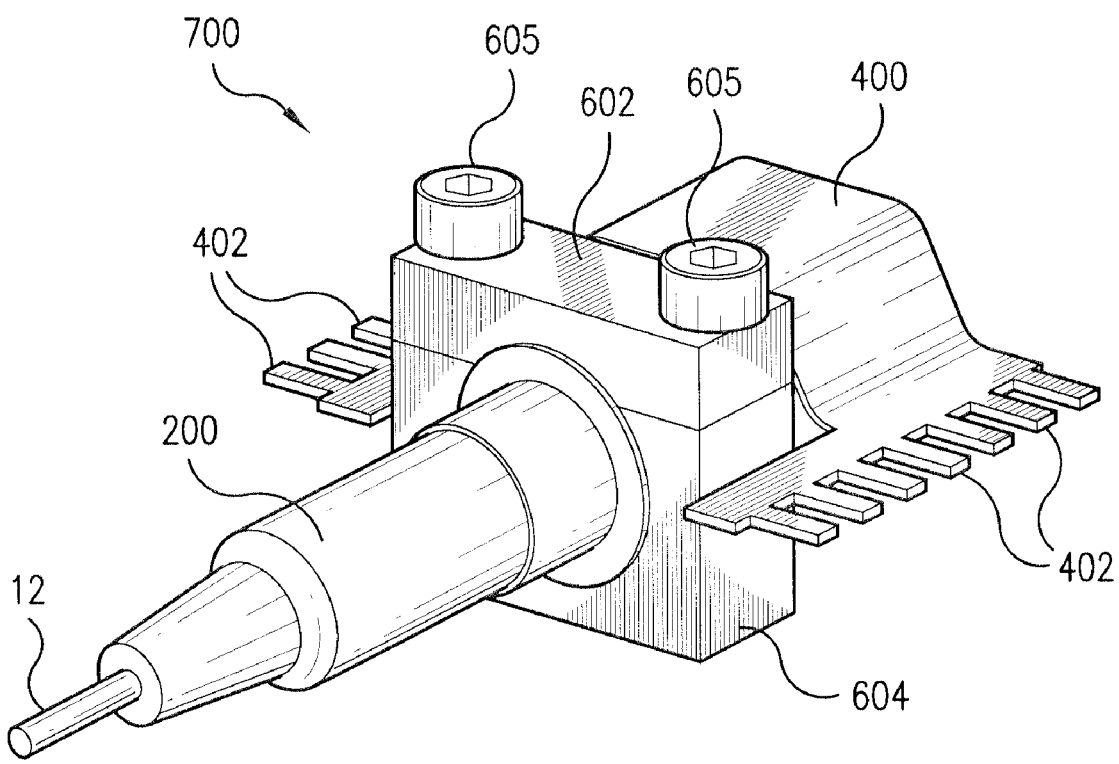
FIG. 12 illustrates an isometric view of an adapted semiconductor laser package in accordance with an embodiment of the invention.

FIG. 12 illustrates another embodiment of an adapted semiconductor laser package 700 including a coaxial laser package 200 with flex-circuit 400 and a housing 600. This housing 600 extends over a limited portion of the adapter 400, particularly at the connection between the pins 206 of the package pinout and the holes 404 of the adapter 400. The housing 600 is positioned between the opposing rows of pins 402. The housing 600 may function to facilitate the connection between the package 200 and the adapter 400. The housing 600 may also function as a heat sink or a conduit between the package 700 and a heat sink similar to that described above.

It will be apparent to one skilled in the art that a large variety of designs and materials that are known in the art may be used for the adapter 400 and the housing 600 to provide a plurality of electrical paths to connect the pin-in arrangement with the adapter pin-out arrangement.

In this text, the term "comprises" and its derivations (such as "comprising", etc.) should not be understood in an excluding sense, that is, these terms should not be interpreted as excluding the possibility that what is described and defined may include further elements, steps, etc.

What is claimed is:

1. An adapted semiconductor laser package comprising:
   a coaxial laser package including a laser, an isolator, a lens, a fiber sleeve, and a pin-out arrangement, the isolator and the fiber sleeve being jointly arranged away from the laser; and
   an adapter that converts the coaxial laser package pin-out arrangement to a selected pin-out arrangement for a printed circuit board, the adapter including a first section with a plurality of holes geometrically arranged and mated with the coaxial laser package pin-out arrangement, a second section with the selected pin-out arrangement with two rows of pins extending along opposite sides of the adapter, and electrical connections between the plurality of holes and the pins.

2. The laser package of claim 1, further comprising a housing that extends around at least a portion of an exterior of the coaxial laser package and the adapter.

3. The laser package of claim 2, wherein the coaxial laser package and the adapter are sealed in an interior of the housing.

4. The laser package of claim 1, wherein the housing extends over a limited portion of the adapter and is positioned between the two rows of pins of the second section of the adapter.

5. The laser package of claim 1, wherein the first section of the adapter includes a substantially circular shape.

6. The laser package of claim 5, wherein the plurality of holes are arranged in one of a circular arrangement and an in-line arrangement.

7. The laser package of claim 1, wherein the adapter includes a unitary construction and the first section is substantially perpendicular to the two rows of pins.

8. The laser package of claim 1, further comprising one-to-one electrical connections between each of the plurality of holes and each of the pins.

9. An adapted semiconductor laser package comprising:
   a coaxial laser package including;
   a semiconductor laser device;
   a fiber sleeve that holds an optical fiber;

a lens that focuses light from the laser device onto an end of the optical fiber;

an isolator that prevents the light from being reflected back towards the laser device;

a coaxial laser package housing that jointly positions the isolator and the fiber sleeve away from the laser device;

a plurality of outwardly-extending pins in a coaxial laser package pin-out arrangement; and an adapter including:
- a pin-in arrangement designed to electrically couple with the coaxial laser package pin-out arrangement;
- an adapter pin-out arrangement geometrically identical to a selected pin-out arrangement; and
- one-to-one electrical connections between the pin-in arrangement and the adapter pin-out arrangement.

10. The laser package of claim 9, wherein the pin-out arrangement includes two rows of pins arranged on opposite sides of the adapter.

11. The laser package of claim 10, wherein each of the two rows of pins includes seven butterfly pins.

12. The laser package of claim 9, further comprising an adapted semiconductor laser package housing that extends around an exterior of the coaxial laser package and the adapter, holds the coaxial laser package and the adapter together, and holds the adapter pin-out arrangement in a single flat format.

13. The laser package of claim 12, wherein the adapted semiconductor laser package housing is fabricated, at least in part, from a thermal conductor.

14. The laser package of claim 12, wherein the adapted semiconductor laser package housing has a cylindrical bore that accommodates at least the plurality of outwardly-extending pins in the pin-out arrangement and the adapter pin-in arrangement.

15. The laser package of claim 12, wherein the adapted semiconductor laser package housing includes a two-piece construction.

16. The laser package of claim 9, wherein the pin-in arrangement includes a plurality of holes that are geometrically arranged to mate with the pin-out arrangement of the coaxial laser package.

17. The laser package of claim 9, wherein there is one-to-one electronic coupling between the annular holes of the pin-in arrangement and the pin-out of the adapter pin-out arrangement.

18. An adapted semiconductor laser package comprising:
- a coaxial laser package including a laser, an isolator, a lens, a fiber sleeve, a hermetically sealed can, and a coaxial laser package pin-out arrangement comprising a plurality of outwardly-extending coaxial laser package pins, wherein the isolator and the fiber sleeve are jointly arranged away from the laser;
- an adapter that converts the coaxial laser package pin-out arrangement to a selected pin-out arrangement, the adapter including a receiving section with a plurality of holes that receive the plurality of outwardly-extending coaxial laser package pins, a first row of pins that extend on a first side of the receiving section and a second row of pins that extend on a second side of the receiving section, the first and second rows being aligned in a common plane and each include a plurality of spaced-apart pins that are perpendicular to the plurality of outwardly-extending coaxial laser package pins, the adapter also including electrical connections that extends between the plurality of holes and the first and second rows of pins; and
- a housing that extends around an exterior of at least a portion of the coaxial laser package and the adapter.

19. The laser package of claim 18, wherein the housing includes first and second sections that each include a semi-circular indent that are aligned together to form a receptacle that extends around the hermetically sealed can of the coaxial laser package.

* * * * *